(12) United States Patent
Zeng et al.

(10) Patent No.: US 10,186,037 B2
(45) Date of Patent: Jan. 22, 2019

(54) OBJECT DATA REPRESENTATIONS FOR ADDITIVE MANUFACTURING

(71) Applicant: Hewlett-Packard Development Company, L.P., Houston, TX (US)

(72) Inventors: Jun Zeng, Sunnyvale, CA (US); Ana Del Angel, Guadalajara (MX); Scott White, Barcelona (ES); Sebastia Cortes I Herms, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/545,253

(22) PCT Filed: Apr. 30, 2015

(86) PCT No.: PCT/US2015/028511
§ 371 (c)(1),
(2) Date: Jul. 20, 2017

(87) PCT Pub. No.: WO2016/175831
PCT Pub. Date: Nov. 3, 2016

(65) Prior Publication Data
US 2018/0040131 A1 Feb. 8, 2018

(51) Int. Cl.
*G06T 7/10* (2017.01)
*B33Y 10/00* (2015.01)
(Continued)

(52) U.S. Cl.
CPC .............. *G06T 7/10* (2017.01); *B33Y 10/00* (2014.12); *B33Y 30/00* (2014.12); *B33Y 50/00* (2014.12);
(Continued)

(58) Field of Classification Search
CPC .. G06T 1/20; G06T 7/10; B33Y 10/00; B33Y 30/00; B33Y 50/00; B33Y 50/02; G06F 17/50
See application file for complete search history.

(56) References Cited

U.S. PATENT DOCUMENTS

| 5,184,307 A | 2/1993 | Hull et al. |
| 6,028,907 A | 2/2000 | Adler |
| (Continued) | | |

FOREIGN PATENT DOCUMENTS

| EP | 1217438 | 6/2002 |
| WO | WO-2014074954 | 5/2014 |

OTHER PUBLICATIONS

International Search Report and Written Opinion dated Feb. 23, 2016; PCT Patent Application No. PCT/US2015/028511, filed Apr. 30, 2015, Korean Intellectual Property Office.
(Continued)

*Primary Examiner* — Ke Xiao
*Assistant Examiner* — Jed-Justin Imperial
(74) *Attorney, Agent, or Firm* — Mannava & Kang

(57) ABSTRACT

In an example, three-dimensional (3D) models of objects are combined for additive manufacturing. Two-dimensional (2D) slices are determined for each 3D model. If the 2D slices are determined to be complete, the 2D slices are combined according to a Boolean operation to generate combined 2D slices printable by an additive manufacturing system.

12 Claims, 7 Drawing Sheets

(51) Int. Cl.
  *B33Y 30/00*   (2015.01)
  *B33Y 50/00*   (2015.01)
  *B33Y 50/02*   (2015.01)
  *G06T 1/20*   (2006.01)
  *G06F 17/50*   (2006.01)

(52) U.S. Cl.
  CPC .............. *B33Y 50/02* (2014.12); *G06F 17/50* (2013.01); *G06T 1/20* (2013.01)

(56) References Cited

U.S. PATENT DOCUMENTS

| | | | |
|---|---|---|---|
| 6,654,656 B2* | 11/2003 | Kesavadas | B29C 64/386 700/119 |
| 7,369,915 B2 | 5/2008 | Kritchman et al. | |
| 8,874,248 B2 | 10/2014 | Young et al. | |
| 2011/0222081 A1 | 9/2011 | Yi et al. | |
| 2012/0224755 A1 | 9/2012 | Wu | |
| 2013/0138234 A1 | 5/2013 | Dufort et al. | |
| 2014/0306955 A1 | 10/2014 | Dionne et al. | |
| 2014/0375636 A1 | 12/2014 | Young et al. | |
| 2015/0029187 A1 | 1/2015 | Nakamura | |
| 2015/0039113 A1 | 2/2015 | Kanada | |
| 2015/0145177 A1* | 5/2015 | El-Siblani | B33Y 10/00 264/497 |
| 2015/0158252 A1* | 6/2015 | Liu | B29C 67/0088 700/98 |
| 2015/0235069 A1* | 8/2015 | Kumar | G06K 7/1426 235/462.09 |
| 2016/0236414 A1* | 8/2016 | Reese | B29C 67/0088 |
| 2017/0148182 A1* | 5/2017 | Yoshida | B33Y 50/00 |

OTHER PUBLICATIONS

Cooke, T., "Perceptual Simiiarities Amongst Novel, 3D Objects", Jan. 15, 2007 http://www.kyb.tuebingen.mpg.de/fileadmin/user_upload/files/publications/cooke_thesis_4230[0].pdf.

* cited by examiner

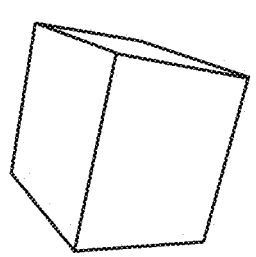
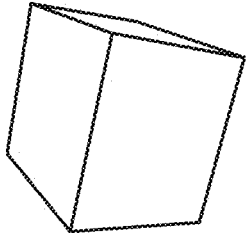
+ −
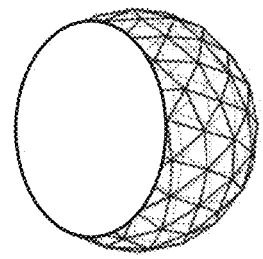
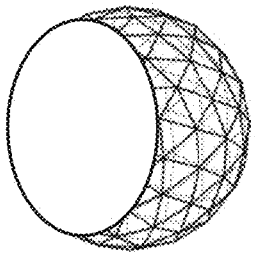
= =
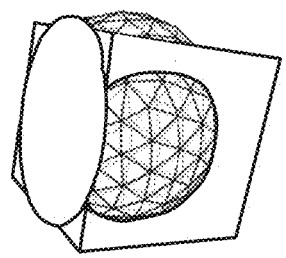
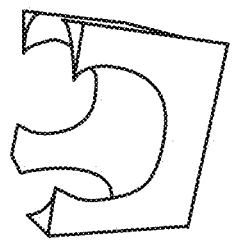
FIG. 4C
FIG. 4D

OBJECT DATA REPRESENTATIONS FOR ADDITIVE MANUFACTURING

CLAIM FOR PRIORITY

The present application is a national stage filing under 35 U.S.C. § 371 of PCT application number PCT/US2015/028511, having an international filing date of Apr. 30, 2015, the disclosure of which is hereby incorporated by reference in its entirety.

BACKGROUND

Additive manufacturing systems, such as three-dimensional (3D) printers, may generate 3D objects through implementation of a layer-by-layer fabrication process. For instance, build material may be solidified layer-by-layer to form the 3D object. These types of systems have been used to build 3D objects having relatively complex internal and external features.

Commonly, an object created through 3D printing is fabricated according to a data representation or model of the object. The 3D model may be a digital representation of a surface geometry and/or volumetric information of the object to be created. The model may be created from scratch or created from a 3D scan of an object or in other ways, such as mathematically, etc. Off-the-shelf software can be used to create the model, and typically stores the model in a file, such as a stereo lithography (STL) file, an additive manufacturing file (AMF) file or another type of 3D modeling file. A file may be loaded into a 3D printer to have the 3D printer create the object from the model.

BRIEF DESCRIPTION OF THE DRAWINGS

Features of the present disclosure are illustrated by way of example and not limited in the following figure(s), in which like numerals indicate like elements, in which:

FIGS. 4C-4D show Boolean operations performed on 3D models, according to examples of the present disclosure;

DETAILED DESCRIPTION

Figure 1:
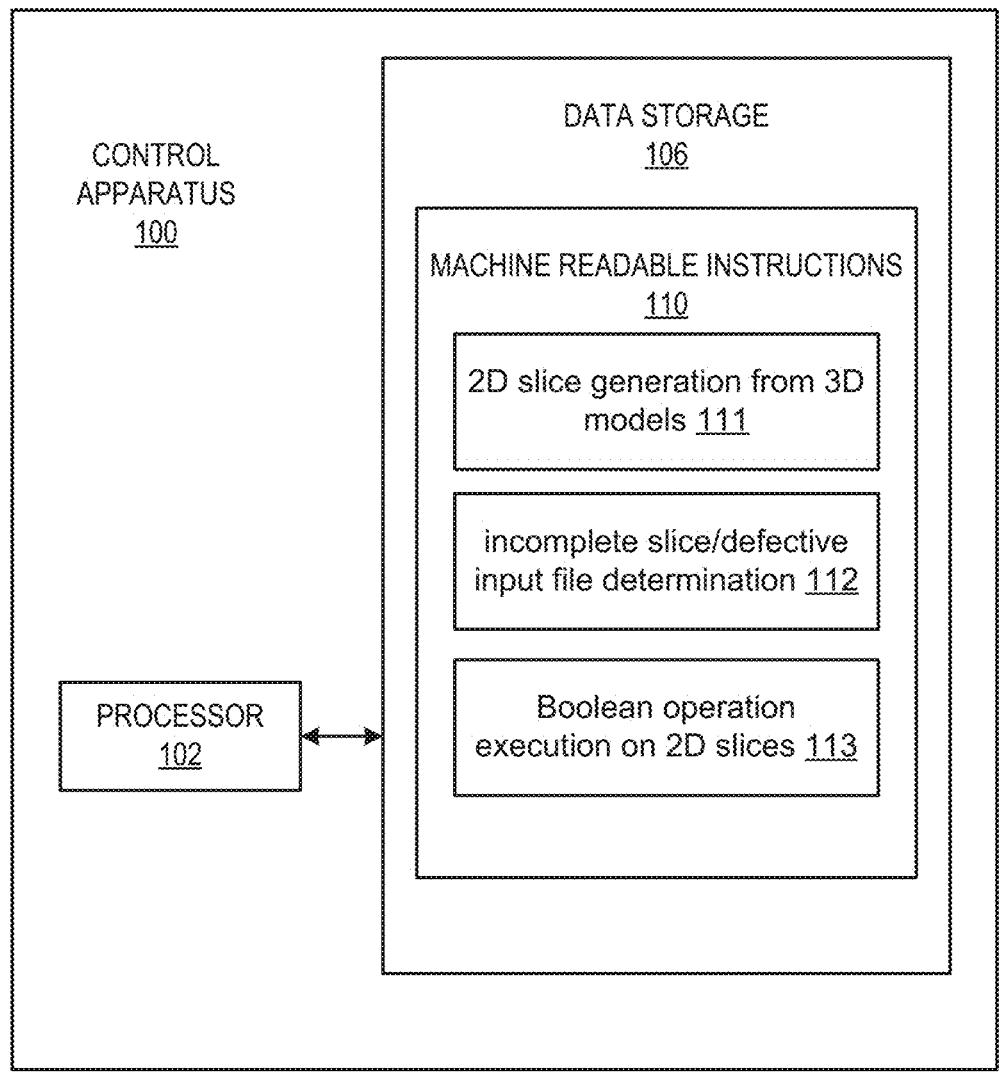
FIG. 1 shows a control apparatus, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to all these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Examples of the present disclosure include generation of 3D representations or models of objects for additive manufacturing, e.g., 3D printing. 3D printing for example includes creating an object by sequentially adding layers of material that are fused or glued together under computer control according to a 3D model of the object. The 3D printing is performed by an additive manufacturing system, such as a 3D printer.

In certain instances, a 3D model of an object is created from 3D models of two or more other objects. For example, a 3D model of one object is combined with a 3D model of another object to create a 3D model of a single object. According to examples of the present disclosure, computer systems and methods enable combining 3D models according to specified Boolean operations on a slice-by-slice basis. For example, a 3D model of each object is sliced to generate two-dimensional (2D) slices of the objects, and a Boolean operation can be performed slice-by-slice to generate combined 2D slices printable by a 3D printer. The 2D slices for example are parallel planes of the 3D models. The combined 2D slices represent each layer of an object generated from the combined models, and are printable by a 3D printer. Examples of the Boolean operation include AND, OR, XOR, etc. These operations may be used for joining, clipping, etc., of at least two objects to form a single object.

The 3D model of an object is a digital representation of the object. For example, the 3D model may be a surface model or solid model. A 3D model describing the surface geometry may be a meshed-based surface geometry model, whereby the mesh refers to a collection of surface elements, such as triangles or other shapes, which form the surface of the object. A meshed-based, surface geometry model is an example of a boundary representation (BREP) model that can be used for 3D printing. Examples of 3D model files may include STL files, AMF files, files describing volumetric information of the object, etc.

The 2D slices, which are combined, may be vectorized layer formats (i.e., vector graphics), and examples of the formats include Common Layer Interface (CLI), Scalable Vector Graphics (SVG), or any format describing polylines defining an exterior and/or an interior of an object. In another example, the 2D slices that are combined may be rasterized layer formats. Boolean operations on vectorized slices may be performed by combining vectors according to the specified Boolean operation such as AND, OR, XOR, etc. Boolean operations on rasterized slices may be performed by sampling the pixels at the same resolution and then let one material type overwrite the other. Boolean operations on rasterized slices may be simpler than vectorized slices. However, for Boolean operations on vectorized slices, the boundaries are explicitly defined such that the detailing agents can be directly applied. For rasterized slices, an additional edge detection (material boundary detection) may be performed.

A programming specification, such as an extensible markup language schema, may be used to specify the models, Boolean operations, and parameters for combining the 3D models. The parameters can specify different material types and indicate which materials to preserve for the Boolean operations. The programming specification is flexible and programmable, and can be re-used to implement a general-purpose, constructive, solid geometry procedure for general-purpose, computer aided design (CAD) shapes.

The 3D models can be complex and combining 3D models in the 3D domain can be error prone and time consuming. For example, an STL file describes a triangulated surface of an object. The triangles can have different sizes and different angles. Performing a Boolean operation, such as a join, on multiple STL files may include matching triangles in each file. Due to the variation in sizes and angles of the triangles, it can be difficult to execute the join to create a water-tight model for an object that can be used for 3D printing for example due to numerical errors. As discussed above, according to an example of the present disclosure, the Boolean operations for joining, clipping, etc. are performed on a per-slice or per-layer basis which effectively converts a 3D Boolean operation into a set of 2D Boolean operation performed on the 2D slices. This not only makes the computations for the Boolean operations much more robust (e.g., line clipping instead of triangle clipping) but also enables better parallelization for faster, in-line results. Also, performing the slicing prior to the Boolean operation allows for earlier detection of defective input files. For example, if a slice is determined not to be water-tight, processing may be stopped and an exception is generated to indicate a defective input file.

FIG. 1 shows a control apparatus 100 that may be used to generate data representations of an object, such as combined 2D slices, for 3D printing, according to an example. It should be understood that the control apparatus 100 may include additional elements and that in some examples some of the elements depicted therein may be removed and/or modified without departing from a scope of the control apparatus 100. The control apparatus 100 may be part of another system, such as included in a 3D printer, or may be a separate apparatus. For example, the control apparatus 100 may be a computer system, such as a server or another type of computer, which generates and sends data representations of layers to a 3D printer for printing.

The control apparatus 100 is depicted as including a processor 102 and a data storage 106. The processor 102 may include one or more processors. For example, the control apparatus 100 may include multiple processors that provide parallel processing of the 3D models. The processor 102 may be a microprocessor, a micro-controller, graphics processor unit, field programmable gate array, an application specific integrated circuit (ASIC), or the like. The data storage 106 may include volatile and/or non-volatile data storage. Examples of the data storage 106 may include memory, such as dynamic random access memory, electrically erasable programmable read-only memory, magnetoresistive random access memory, memristor, flash memory, hard disk, or other optical or magnetic or other type of non-transitory computer readable medium.

The data storage 106 may store machine readable instructions 110. The machine readable instructions are executable by the processor to perform functions and operations described herein. Examples of the functions are shown as 111-113 and may include 2D slice generation from 3D models 111, incomplete slice/defective input file determination 112, and Boolean operation execution on 2D slices 113. In another example, at least one of the functions is performed by hardware, such as an ASIC, field programmable gate array or other customized circuit, instead of by executing machine readable instructions.

Although not shown, the data storage 106 may also store data for the processing functions. For example, the data storage 106 may store 3D models of objects which are combined according to the Boolean operation at 113. Other data may also be stored in the data storage 106. For example, the functions process the 3D models to generate 2D slices and combine the 2D slices according to Boolean operations that may be specified in a programming specification. The 2D slices, combined 2D slices and/or the programming specification may be stored in the data storage 106. The combined 2D slices each define a respective layer of an object to be created during the additive manufacturing process. For example, each combined 2D slice is used by the 3D printer to generate a layer of build material that is solidified during the additive manufacturing process, and the layers form the object created from combining the 3D models according to the specified Boolean operation. Although not shown, the control apparatus 100 may include an interface comprised of hardware and/or software to allow communication over a wired or wireless connection to another apparatus for example via a network.

Figure 2:
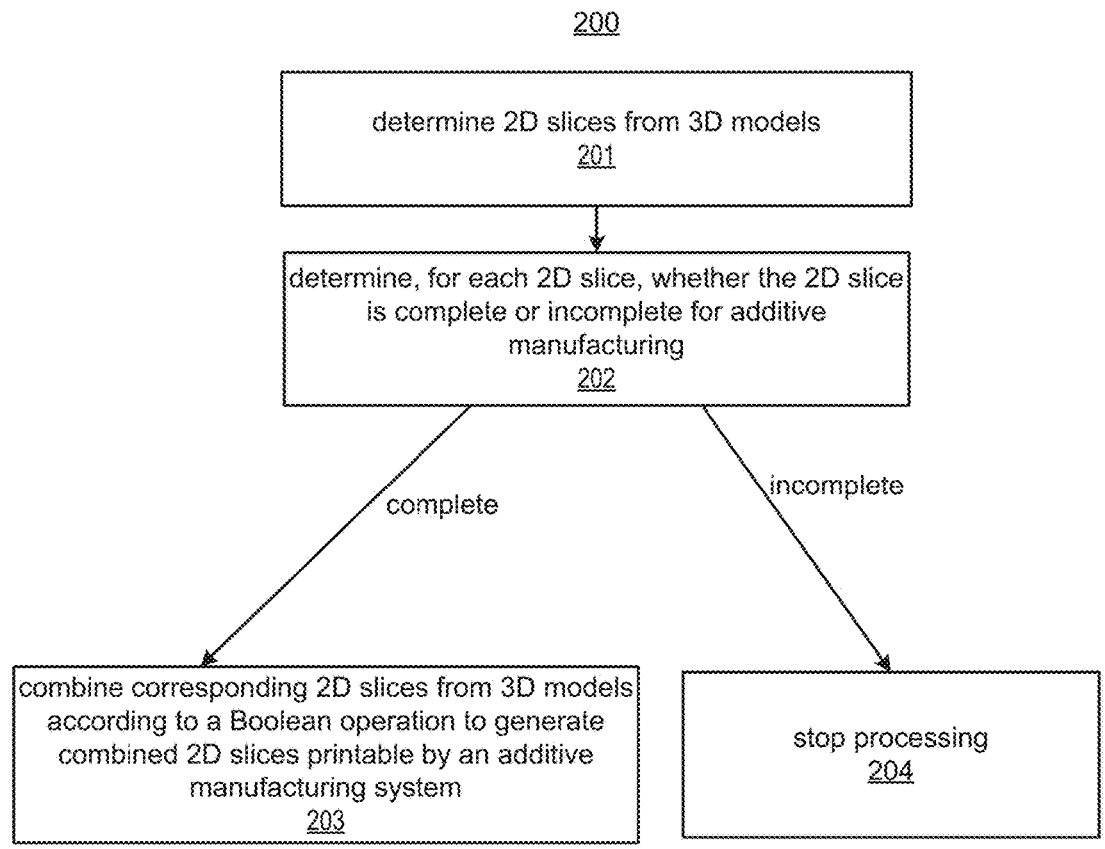
FIG. 2 shows a flow diagram of a method for generating combined two-dimensional (2D) slices for additive manufacturing, according to an example of the present disclosure.

FIG. 2 shows a method 200 according to an example for combining 3D models. The method 200 and other methods and data flows described below are described as being performed by the control apparatus 100 by way of example. The methods and data flows, however, may be performed by other apparatus and systems. At 201, the processor 102 determines 2D slices from 3D models of objects to be combined. For example, a 3D model represents an object in a coordinate space. The 3D model is sliced along an axis, referred to as the slicing axis, to generate slices along coordinates of the slicing axis. Each 3D model to be combined is sliced. At 202, the processor 102 determines, for each 2D slice, whether the 2D slice is complete or incomplete for additive manufacturing. This determination may be used to identify a defective 3D model from 201. For example, a complete 2D slice can be generated by a 3D printer but an incomplete 2D slice cannot, and may be indicative of a defective input file for a corresponding 3D model. In an example, a complete 2D slice is comprised of an enclosed polygon or area (or multiple enclosed areas or polygons) where material is deposited and fused during the build process of that slice. For example, a determination is made as to whether an outer surface or boundary of a 2D slice is a complete polygon, which is further described with respect to FIGS. 5B-5C. For example, the outer surface or boundary of the enclosed area or polygon where material is to be deposited and fused during the build process of the slice should form a closed polygon without gaps. The complete 2D slice for example represents a water-tight layer. An incomplete 2D slice for example represents a non-water-tight layer; e.g., an outer surface does not form a complete polygon and has gaps. At 203, in response to determining the 2D slices are complete, the corresponding 2D slices for the 3D models are combined according to a Boolean operation or multiple Boolean operations to generate combined 2D slices printable by an additive manufacturing system, such as a 3D printer. The corresponding 2D slices for example are slices for the same coordinate of the slicing axis. At 204, in response to determining a 2D slice is incomplete, processing is stopped. A message or other indication may be generated to indicate that there may be a defective 3D model/input file including the 3D model. This message may also include markers on the solid model indicating which layer is not water-tight. In an example, all the 2D slices generated from each of the 3D models to be combined should be complete to proceed to the combining at 203; otherwise the corresponding 3D model file may be considered defective and processing is stopped at 204.

Figure 3:
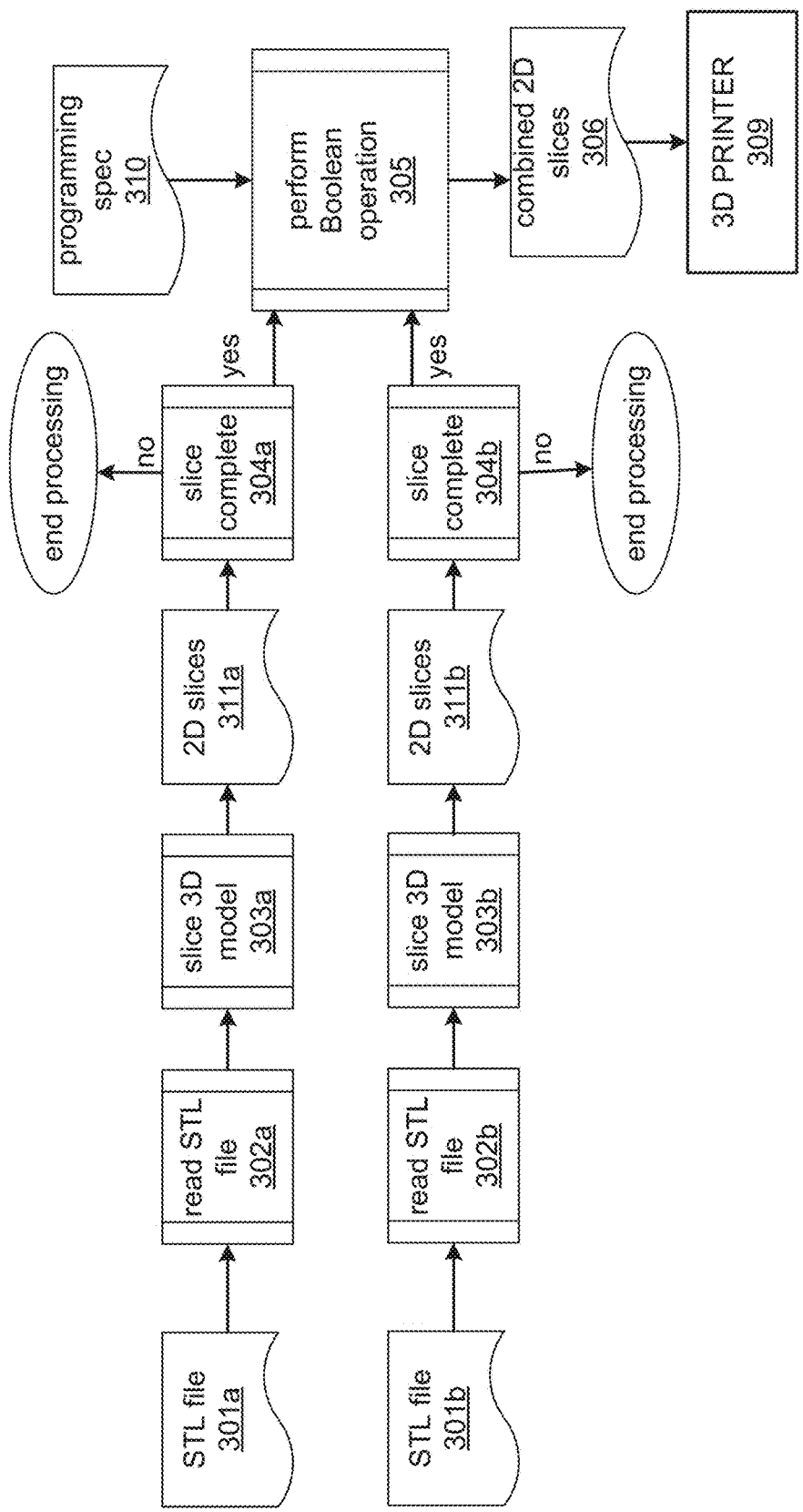
FIG. 3 shows a data flow diagram, according to an example of the present disclosure.

FIG. 3 shows a data flow diagram 300 according to an example. The data flow diagram 300 includes one or more operations of the method 200. In this example, two 3D models are provided as input files (e.g., STL files) 301a and 301b. At 302a and 302b, the STL files 301a and 301b are read for example by the processor 102 and sliced at 303a and 303b to generate 2D slices 311a and 311b. At 304a and 304b, the processor 102 determines whether each 2D slice is complete. If any 2D slice is not complete, processing is stopped. If yes, at 305, the corresponding 2D slices are mated according to a Boolean operation. For example, for each z-coordinate of a z-axis, e.g., the slicing axis, a Boolean operation such as clip, join, etc., joins the corresponding 2D slices into a single layer, i.e., the combined 2D slice. The output of the Boolean operation is the combined 2D slices 306. The combined 2D slices 306 may be sent to a 3D printer 309 for printing. A programming specification 310 may be provided as input to the processor 102 to identify the 3D models and determine the Boolean operation to perform on the 3D models, along with parameters for the Boolean operation. The programming specification 310 is read at 305 to determine the Boolean operation to perform. An example of the programming specification is described below with respect to FIG. 6.

Figure 4A:
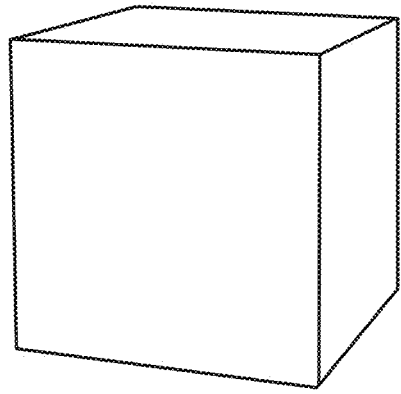
FIGS. 4A-4B show 3D models, according to examples of the present disclosure.
Figure 4B:
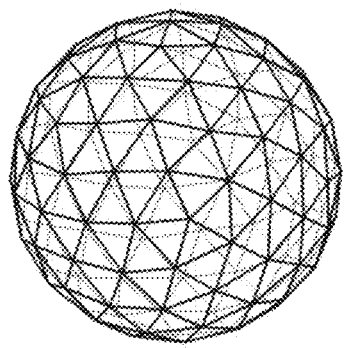

FIGS. 4A-D show examples of 3D models and examples of the operations shown in FIGS. 2-3. For example, FIG. 4A shows a 3D model of a block represented by STL file 301a, and FIG. 4B shows a 3D model of a sphere represented by STL file 301b. As discussed above, with respect to 202 and 305, a Boolean operation is performed, and FIGS. 4C-D show examples of the Boolean operation. FIG. 4C shows a join performed for corresponding 2D slices of the 3D models of STL files 301a and 301b. In FIG. 4C, the 3D model of the sphere is added to the 3D model of the block. The material for the sphere, which may be different than material for the block, is added to the block, displacing the original material from the block. FIG. 4D shows clipping performed for corresponding slices of the 3D models of STL files 301a and 301b. In FIG. 4D, the 3D model of the sphere is removed from the 3D model of the block. In this case, the material that forms the block is removed without re-filling with the material from the sphere. FIGS. 4C-D show partial completion of the Boolean operations, such as up to layer 28 of 40 total layers, but the operations for combining the corresponding 2D slices are repeated until both 3D models are fully combined, unless an input 3D model is determined to be defective.

Figure 5A:
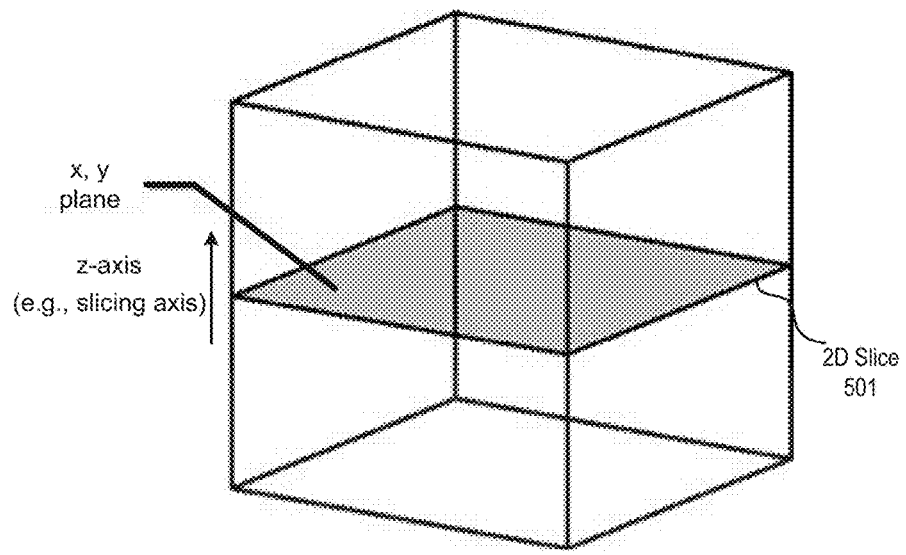
FIG. 5A shows a 3D model and a 2D slice, according to an example of the present disclosure.

At 201 of the method 200 and at 303a and 303b of the data flow diagram 300, 2D slices are created from the 3D model. A 3D slicer may be used to generate the 2D slices. The 3D slicer for example is machine readable instructions executed by the processor 102. Open source 3D slicers are available as well as 3D slicer utilities that are included in off-the-shelf 3D modeling software. The 3D models that are sliced may be solid models, e.g., created using primitive instancing or constructive solid geometry or surface models, e.g., created by BREP. The slicing is performed along the same slicing axis for all the 3D models. For example, as shown in FIG. 5A, the 3D model of a block is sliced along coordinates of the z-axis, which is the slicing axis in this example, and each 2D slice is in the x-y plane. A single 2D slice 501 is shown but the entire block is sliced along coordinates of the z-axis. The x, y and z axes form the coordinate space of the 3D model.

Figures 5B, 5C:
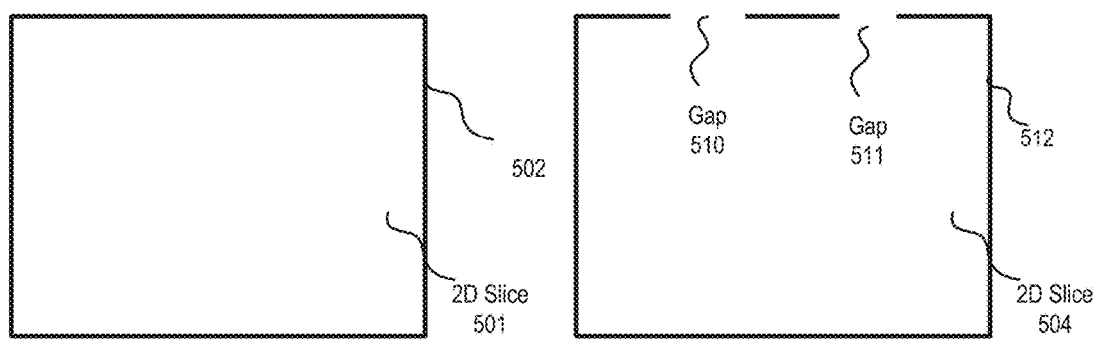
FIGS. 5B-C show a complete and incomplete 2D slice, according to examples of the present disclosure.

As discussed above, such as at 202 of the method 200 and at 304a and 304b of FIG. 3, each 2D slice is evaluated to determine whether it is complete or incomplete. Also, as discussed above, a complete 2D slice is comprised of a complete polygon. For example, an outer surface or boundary of the 2D slice is evaluated to determine whether it is a complete polygon. For example, as shown in FIG. 5B, the outer edge of the 2D slice 501 represents an outer surface or boundary of the layer. The outer edge of the 2D slice 501, which is shown as 502 in FIG. 5B, forms a complete square. In other words, there are no gaps in 502 and it forms a complete polygon, i.e., a square with no gaps), and the layer (i.e., 2D slice) is considered complete and water-tight. FIG. 5C shows an example where a 2D slice 504, which may also be a slice of the block shown in FIG. 5A, is incomplete. For example, gaps 510 and 511 are in the boundary or outer surface 512, and thus the corresponding layer is not water-tight. An object may have multiple outer surfaces or boundaries. A complete slice may be based on whether each of the outer surfaces forms a complete polygon.

Figure 6:
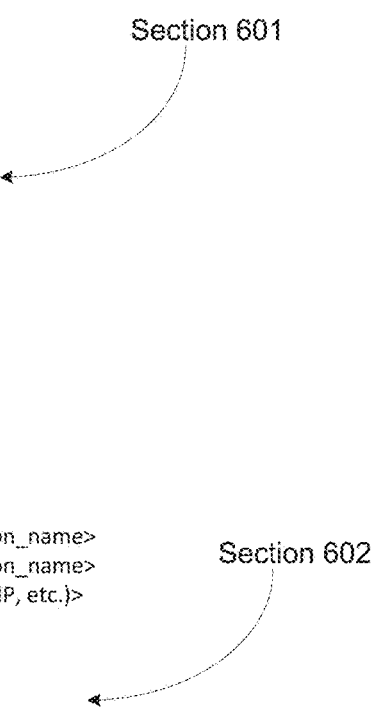
FIG. 6 shows a programming specification, according to an example of the present disclosure.

As discussed above with respect to FIG. 3, a programming specification 310 may be provided as input to the processor 102 to identify the 3D models and determine the Boolean operation to perform on the 3D models, along with parameters for the Boolean operation. An example of a schema 600 of the programming specification is shown in FIG. 6. The schema may be an extensible markup language schema. The schema may be programmed by a user to control the Boolean operations. Section 601 of the schema 600 is where 3D models to be combined are identified. Information, such as model name, file name, mass center, orientation, scaling may be provided for each 3D model. Section 602 is where the Boolean operation or operations are specified, along with parameters for each Boolean operation. For example, for each Boolean operation, the operation name is specified, and operands for the operation are specified. An operation type is also specified. The parameters may specify the attributes, properties, etc. for the Boolean operation. The parameters can indicate the materials for the Boolean operation. For example, if an object is being created that is comprised of multiple materials, the parameters may specify which materials to clip or retain for the Boolean operation. The schema 600 makes it easy to program creation of an object that may be comprised of multiple materials by executing multiple Boolean operations on multiple 3D models.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure. Also, what has been described and illustrated herein are examples of the disclosure along with some variations. The terms, descriptions and figures used herein are set forth by way of illustration. Many variations are possible within the scope of the disclosure.

What is claimed is:

1. An apparatus for generating data representations of an object for additive manufacturing, the apparatus comprising:
at least one processor to
determine two-dimensional (2D) slices for each of 3D models of objects, wherein the 2D slices are for coordinates along a slicing axis;
for each 2D slice, determine whether the 2D slice is complete or incomplete for additive manufacturing, wherein the 2D slice is complete when a boundary of the 2D slice forms a closed area, and the 2D is incomplete when the boundary of the 2D slice has a gap, wherein to determine whether the 2D slice is complete or incomplete, the at least one processor is to:

determine whether the boundary of the 2D slice forms a closed polygon;

in response to determining the boundary forms a closed polygon, determine the 2D slice is complete; and in response to determining the boundary has a gap, determine the 2D slice is incomplete; and in response to determining the 2D slices are complete, combine corresponding 2D slices for each coordinate according to a Boolean operation to generate combined 2D slices printable by an additive manufacturing system.

2. The apparatus of claim 1, wherein in response to the at least one processor determining that at least one of the 2D slices is incomplete, generating an indication of a defective 3D model.

3. The apparatus of claim 1, wherein the 3D models comprise solid or surface models.

4. The apparatus of claim 1, wherein the 2D slices are in a vectorized layer format or a raster format.

5. The apparatus of claim 1, wherein the additive manufacturing system generates a 3D object comprised of layers defined by the combines 2D slices.

6. The apparatus of claim 1, wherein the Boolean operation comprises at least one of AND, OR, and XOR.

7. The apparatus of claim 1, wherein the objects are comprised of different materials and to combine corresponding 2D slices, the at least one processor is to determine which of the materials to include or remove for the combined 2D slices.

8. A computer system to generate data representations of an object for additive manufacturing, the computer system comprising:

data storage to store a schema-based programming specification, wherein the programming specification identifies 3D models for objects;

for each 3D model, at least one of a mass center, orientation and scaling in a coordinate space;

a Boolean operation to be performed on the 3D models; and parameters for the Boolean operation;

at least one processor to generate two-dimensional (2D) slices for each of the stored 3D models for coordinates along a slicing axis in the coordinate space of the 3D models;

for each 2D slice, determine whether the 2D slice is complete or incomplete, wherein the 2D slice is complete when a boundary of the 2D slice forms a closed area, and the 2D is incomplete when the boundary of the 2D slice has a gap, wherein to determine whether the 2D slice is complete or incomplete, the at least one processor is to:

determine whether the boundary of the 2D slice forms a closed polygon;

in response to determining the boundary forms a closed polygon, determine the 2D slice is complete; and in response to determining the boundary has a gap, determine the 2D slice is incomplete; and in response to determining the 2D slices are complete, combine corresponding 2D slices at each of the coordinates along the slicing axis according to the Boolean operation and the parameters to generate combined 2D slices printable by an additive manufacturing system.

9. The computer system of claim 8, wherein the objects are comprised of different materials and the parameters specify which of the materials to include or remove when performing the Boolean operation.

10. The computer system of claim 8, wherein in response to the at least one processor determining that at least one of the 2D slices is incomplete, generating an indication of a defective 3D model.

11. A method for generating data representations of an object for additive manufacturing, the method, performed by at least one processor, comprising:

determining two-dimensional (2D) slices for each of a plurality of 3D models of objects;

for each 2D slice, determining whether the 2D slice is complete or incomplete for additive manufacturing, wherein the 2D slice is complete when a boundary of the 2D slice forms a closed area, and the 2D is incomplete when the boundary of the 2D slice has a gap, wherein determining whether the 2D slice is complete or incomplete comprises:

determining whether the boundary of the 2D slice forms a closed polygon;

in response to determining the boundary forms a closed polygon, determining the 2D slice is complete; and in response to determining the boundary has a gap, determining the 2D slice is incomplete;

in response to determining the 2D slices are complete, combining corresponding 2D slices according to a Boolean operation to generate combined 2D slices printable by an additive manufacturing system; and in response to determining at least one of the 2D slices is incomplete, ending the combining of the corresponding 2D slices according to the Boolean operation.

12. The method of claim 11, wherein the Boolean operation comprises at least one of AND, OR, and XOR.

* * * * *